(12) United States Patent
Yan et al.

(10) Patent No.: US 6,734,544 B2
(45) Date of Patent: May 11, 2004

(54) INTEGRATED CIRCUIT PACKAGE

(75) Inventors: Soupin Yan, San Jose, CA (US);
Krishna Seshan, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/387,046

(22) Filed: Mar. 12, 2003

(65) Prior Publication Data

US 2003/0155640 A1 Aug. 21, 2003

Related U.S. Application Data

(62) Division of application No. 09/216,140, filed on Dec. 18, 1998, now Pat. No. 6,552,425.

(51) Int. Cl.$^7$ .............................................. H01L 23/48
(52) U.S. Cl. ...................................... 257/690; 257/778
(58) Field of Search ............................ 257/690, 692, 257/693, 732, 735, 738, 778, 737, 786

Primary Examiner—Roy Potter
(74) Attorney, Agent, or Firm—Schwegman, Lundberg, Woessner & Kluth, P.A.

(57) ABSTRACT

An integrated circuit package is disclosed. According to one embodiment of the present invention an integrated circuit is formed in a die having an edge, and a plurality of non-I/O columns are bonded between a substrate and the die a selected distance from the edge of the die.

26 Claims, 11 Drawing Sheets

INTEGRATED CIRCUIT PACKAGE

This application is a divisional of U.S. patent application Ser. No. 09/216,140, filed Dec. 18, 1998 now U.S. Pat. No. 6,552,425, which is incorporated herein by reference in its entirety.

FIELD OF THE INVENTION

The present invention relates generally to integrated circuits, and more particularly to an integrated circuit package.

BACKGROUND

Integrated circuits (IC's) are made up of devices such as transistors and diodes and elements such as resistors and capacitors linked together by conductive connections to form one or more functional circuits. IC's are typically formed in a rectangular piece of silicon called a chip or die. Silicon dice can be formed in a wafer of silicon. A wafer is a sheet of silicon with a surface that is subject to a series of fabrication steps to form a pattern of identical IC's. The IC's are separated from each other by a repeating rectangular pattern of scribe lines, also called saw lines, in the surface of the wafer that serve as boundaries between the dice. One IC is formed in each die. At a late stage in a fabrication process the dice are diced (cut apart) from the wafer along the scribe lines and each die is bonded to a substrate to form an IC package.

A substrate is a relatively flat and rigid structure that provides mechanical support for the die in the IC package, transmits input/output (I/O) signals to and from the IC in the die, and also transfers heat that is generated during the operation of the IC. The substrate may also be called a carrier. The substrate includes conductive leads connected to respective bonding pads on the die so that the IC may exchange I/O signals with other circuits in the IC package and circuits connected to the IC package. Additional elements such as resistors and capacitors that are not readily included in the IC may be attached to the IC package. The IC package may be applied to a circuit board assembly that comprises systems of interconnected IC packages to form an electronic device such as a computer or a cellular phone.

One method of bonding a die to a substrate in an IC package is called a flip-chip bonding method. One version of the flip-chip bonding method is formally known as the controlled collapse chip connection or C4 method. In the flip-chip bonding method solder bumps are placed on bonding pads on the dice while they are connected together in the wafer. A reflow procedure is carried out to modify the shape of the bumps and then the wafer is diced to separate the dice. Each die is then turned over, or flipped, and aligned with a corresponding pattern of bonding pads or solder bumps on a substrate. A second reflow procedure is carried out to join the bumps to form a series of solder columns between the die and the substrate. The solder columns serve as conductive connections or leads between an IC in the die and the substrate through which I/O signals are transmitted. An epoxy underfill is then added between the die and the substrate, surrounding the solder columns. A fillet is formed of epoxy near the edges of the die and the epoxy is then cured to finish the fabrication of the IC package.

Most IC packages are tested under simulated operating conditions before being shipped to a customer. The test includes a thermal cycling of the IC package; the IC package is put in a furnace and the temperature of the furnace is raised and lowered in a cycle to simulate temperatures that may be encountered by the IC package in its normal operation. Stresses develop in the IC package due to different coefficients of thermal expansion of the substrate, the epoxy, and the die. The thermal cycling causes shear stresses that lead to cracks in a nitride surface layer in the die, and these cracks can propagate to open metal vias and lift metal connections in the die. In addition, the epoxy underfill includes hard particles that cause bullet holes and cracks in the die when subject to compressive stresses during the thermal cycling. Such cracking leads to a reliability failure of the IC package.

There remains a need for an IC package and ways of fabricating the IC package to reduce the above-mentioned problems. For these and other reasons there is a need for the present invention.

SUMMARY OF THE INVENTION

According to one embodiment of the present invention an integrated circuit is formed in a die having an edge, and a plurality of non-I/O columns are bonded between a substrate and the die a selected distance from the edge of the die. According to another embodiment of the present invention an integrated circuit is formed in a die having an edge, deformable adhesive bumps are placed on the die in a high strain region of the die and on a surface of a substrate, the deformable adhesive bumps are aligned, and the die is bonded to the substrate by reforming the deformable adhesive bumps into a plurality of columns bonded between the substrate and the die to reduce strain in the die.

DETAILED DESCRIPTION

In the following detailed description of exemplary embodiments of the present invention, reference is made to the accompanying drawings which form a part hereof, and in which are shown by way of illustration specific exemplary embodiments in which the present invention may be practiced. These embodiments are described in sufficient detail to enable those skilled in the art to practice the present invention, and it is to be understood that other embodiments may be utilize and that logical, mechanical, electrical and other changes may be made without departing from the spirit or scope of the present invention. The following detailed description is, therefore, not to be taken in a limiting sense, and the scope of the present invention is defined only by the claims.

The exemplary embodiments are shown in the drawings with different views of similar elements. Where an element is shown in several Figures it will be identified with the same reference character for purposes of clarity.

Cracks occur with particular frequency at the edges and the corners of a die bonded to a substrate according to the flip chip bonding method and subject to thermal cycling. One cause of these cracks may be a plastic deformation of epoxy underfill between the die and the substrate during the thermal cycling. The plastic deformation occurs because the die, the substrate, and the epoxy underfill in an IC package each have a different coefficient of thermal expansion. When the temperature of the IC package cycles up and down each of these elements expand and contract in different proportions causing both compressive and shear stresses in the IC package. These stresses induce plastic deformation of the epoxy underfill, and substantial strain at the edges of the die because in the conventional flip chip bonding method there are no solder columns near the edge of the die, and the die is separated from the substrate by the epoxy underfill alone. In addition to providing electrical connections for transmitting I/O signals between the IC and the substrate, the solder columns also provide mechanical support for the die when it undergoes thermal cycling. The solder columns carry a majority of the loading caused by the compressive and shear stresses and serve as a stress buffer between the die and the substrate during the thermal cycling. At the edges and corners of the die there is a substantial area of silicon that is therefore subject to shear stress induced by the plastic deformation of the epoxy underfill without the support of solder columns connected to the substrate. The shear stress results in strain in the die which leads to cracking in the surface of the die.

Cracking in the die due to thermal cycling may be reduced according to an embodiment of the present invention by placing solder columns close to the edges of the die so that the edges of the die are supported by the solder columns. The solder columns near the edge of the die bear a substantial portion of the shear stress induced by the plastic deformation of the epoxy underfill to reduce strain in the edges of the die during the thermal cycling. The solder columns close to the edge of the die are supplemental to the solder columns transmitting I/O signals between the IC and the substrate. Some or all of the supplemental solder columns close to the edge of the die may not be connected to functional circuits in the IC to transmit I/O signals between the IC and the substrate, and these columns are called non-I/O columns. The solder columns transmitting I/O signals are called I/O columns.

Figure 1:
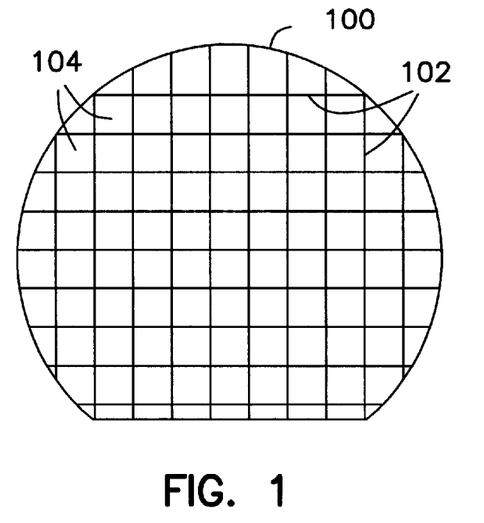
FIG. 1 is a top view of a wafer.
Figure 2:
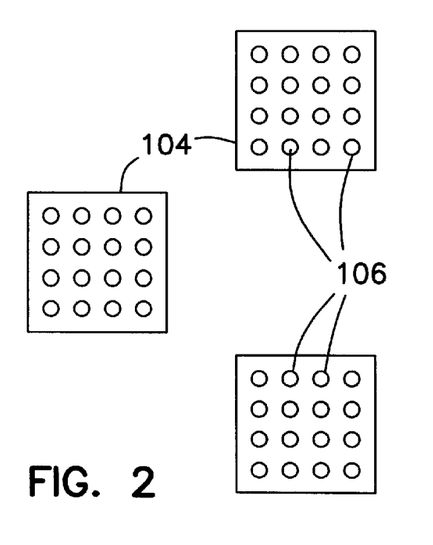
FIG. 2 is a top view of several dice.
Figure 14:
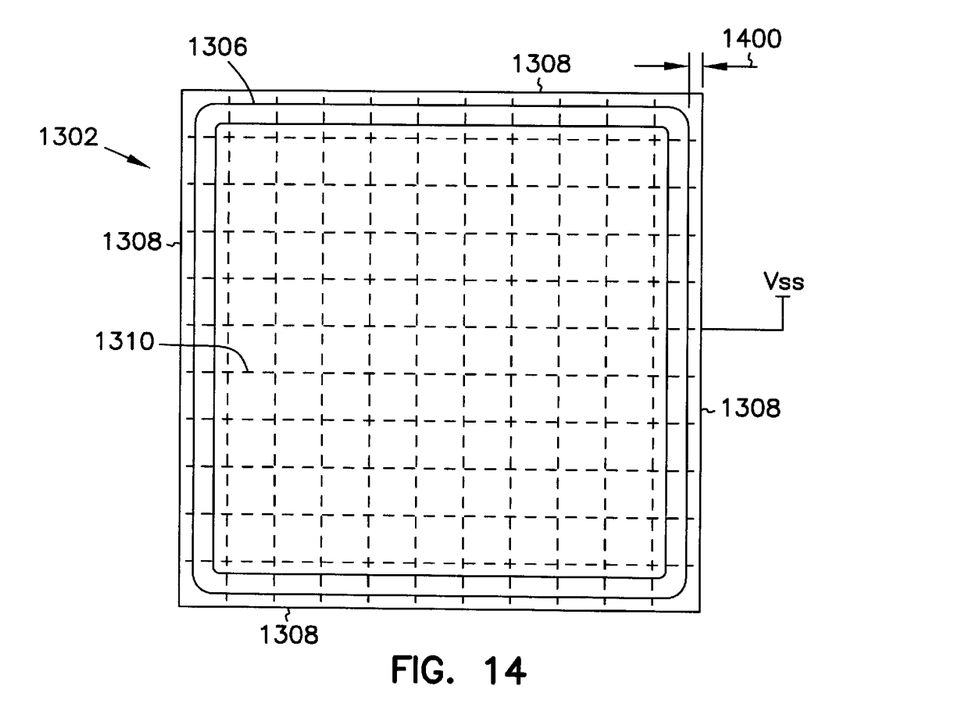
FIG. 14 is a top view of a die.

A method for assembling an IC package according to an embodiment of the present invention is shown in FIG. 14. A wafer 100 is shown in FIG. 1 with a repeating rectangular pattern of scribe lines 102 serving as boundaries between dice 104 in the wafer. Each die 104 contains an IC with a number of solder bumps (not shown in FIG. 1) placed on a surface of the die 104. Selected solder bumps are placed close to the scribe lines 102 surrounding each die 104, and are separated from the scribe lines 102 by a selected distance. The wafer 100 is subject to a reflow procedure to modify the shape of the solder bumps, and then the dice 104 are cut from the wafer 100 along the scribe lines 102 in a dicing operation. Several dice 104 are shown in FIG. 2 separated from the wafer 100, and solder bumps 106 are shown on the surface of each die 104. The solder bumps 106 placed close to the scribe lines 102 do not extend beyond the scribe lines 102 so that they do not interfere with the cutting of the wafer 100.

Figure 3:
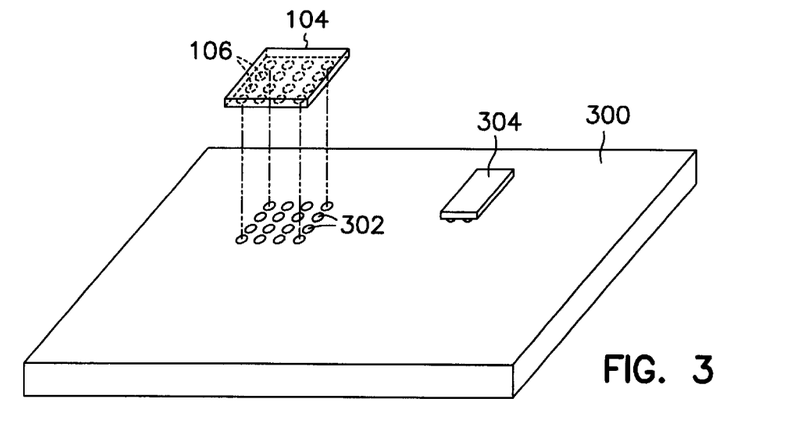
FIG. 3 is a perspective view of an assembly of an IC package.

One of the dice 104 is shown being aligned over a plastic substrate 300 in FIG. 3. The solder bumps 106 are shown on the surface of the die 104 that has been flipped according to the flip-chip method. A matching set of bonding pads or solder bumps 302 is shown on the substrate 300. The die 104 and the substrate 300 are assembled to form an IC package 400 shown in FIG. 4 in the following manner. The solder bumps 106 are aligned with and brought into contact with the solder bumps 302 and another reflow procedure is carried out to reform the solder bumps 106, 302 into solder columns 402 bonding the die 104 to the substrate 300.

Figure 5:
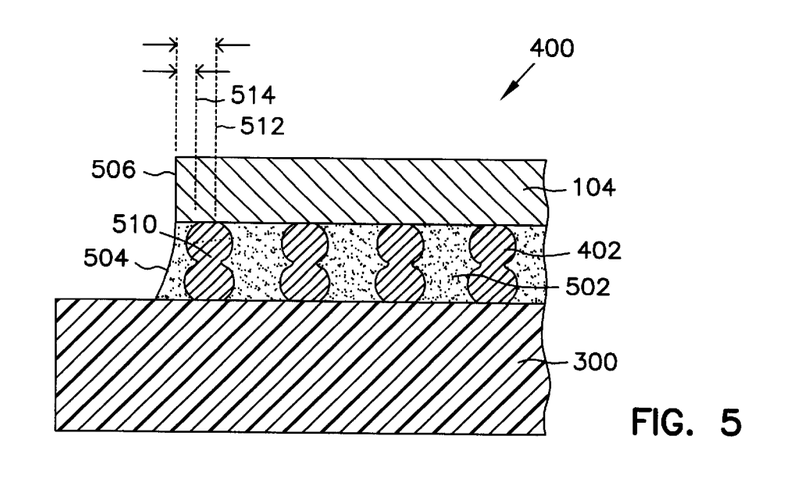
FIG. 5 is a cross-sectional view of an IC package.

A final step in the assembly is shown in a cross-sectional view of the IC package 400 in FIG. 5. Epoxy 502 is forced between the die 104 and the substrate 300 around the solder columns 402. The epoxy 502 is more generally called an underfill material because it fills in the space between the die 104 and the substrate 300. Materials other than epoxy known to those skilled in the art having the benefit of this description may be substituted for the epoxy 502 as an underfill material. The epoxy 502, which will be called the epoxy underfill 502, is forced in by methods known to those skilled in the art having the benefit of this description, and a fillet 504 of epoxy is formed at an edge 506 of the die 104. The solder columns 402 have an hourglass shape formed from the reflow of the solder bumps 106,302.

Some of the solder columns 402, such as a solder column 510, are placed close to the edge 506 to bear stress loading when the IC package 400 undergoes thermal cycling. Strain in the die 104 near the edge 506 is reduced by the presence of the solder column 510 during the thermal cycling, and cracking in the die 104 is reduced. The solder column 510 has a center on a center line 512, a diameter, and an edge near the edge 506 of the die 104 that is shown by line 514. The solder column 510 is positioned close to the edge 506 as shown by the distances between the edge 506 and the lines 512 and 514. In one embodiment of the present invention the distance between the edge 506 and the center of the solder column 510 is less than or equal to the diameter of the solder column 510. In another embodiment of the present invention the distance between the edge 506 and the edge of the solder column 510 is less than or equal to the diameter of the solder column 510. One skilled in the art having the benefit of this description will recognize that more than one solder column 402, in addition to the solder column 510, may be placed close to the edge 506 of the die 104 as described above.

Figure 6:
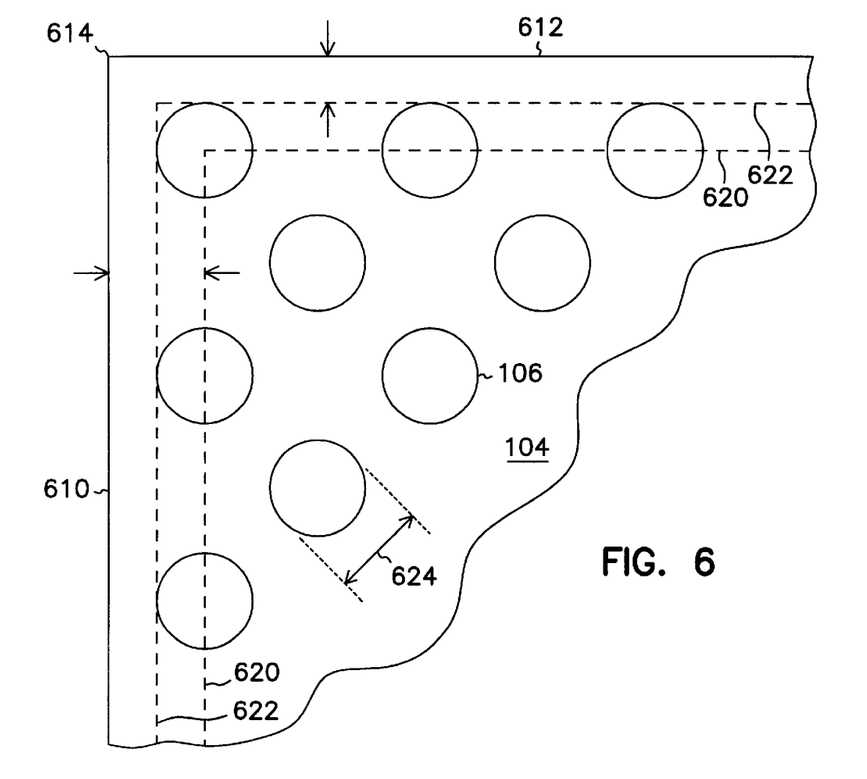
FIG. 6 is a top view of a placement of solder bumps on a die.
Figure 7:
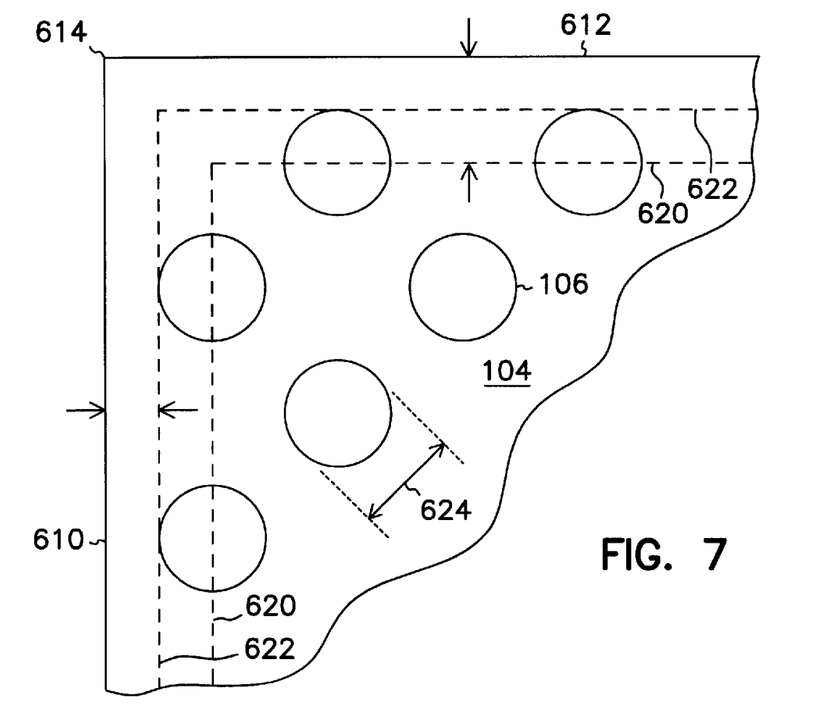
FIG. 7 is a top view of a placement of solder bumps on a die.
Figure 8:
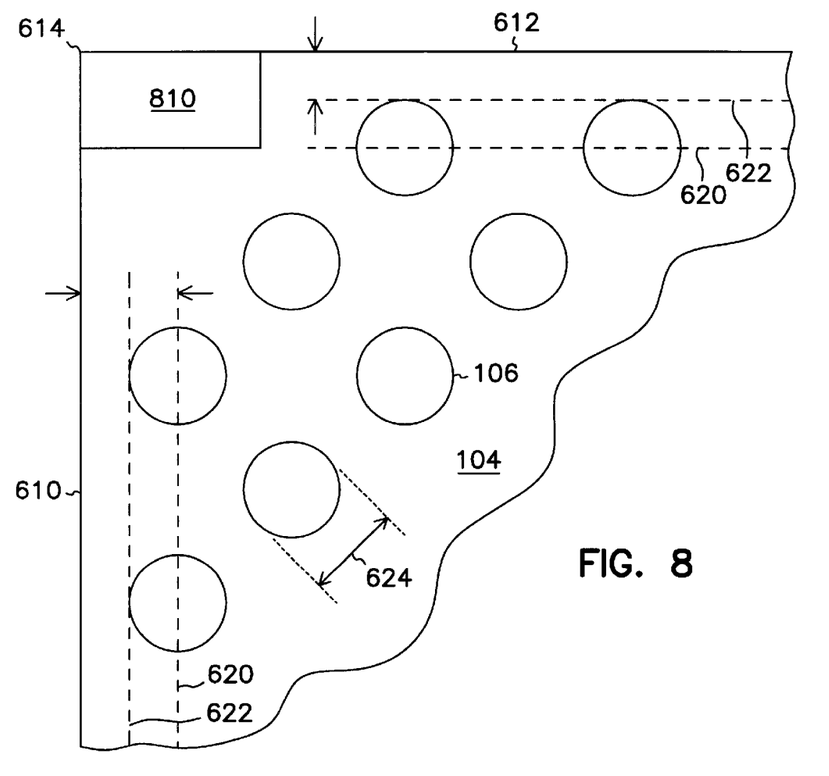
FIG. 8 is a top view of a placement of solder bumps on a die.

The placement of the solder bumps 106 on the die 104 determines the location of the solder columns 402 in the IC package 400 as shown in FIGS. 1–4. In FIGS. 6–8 several patterns of solder bumps 106 are shown placed near a corner of the die 104 according to several embodiments of the present invention. In each of FIGS. 6–8 similar lines and elements retain the same reference characters for purposes of clarity.

In FIG. 6 the solder bumps 106 are placed along two edges 610, 612 of the die 104 including a corner 614 where the edges 610, 612 meet Centers of selected solder bumps 106 are aligned on lines 620, and edges of the selected solder bumps 106 are aligned on lines 622. A diameter of each of the solder bumps 106 is indicated at 624. In one embodiment of the present invention the distance between the centers of the selected solder bumps 106 and the edges 610, 612 is less or equal to the diameter 624. In another embodiment of the present invention the distance between the edges of the selected solder bumps 106 and the edges 610, 612 is less or equal to the diameter 624. An arrangement of the solder bumps 106 according to another embodiment of the present invention is shown in FIG. 7 in which two selected solder bumps 106 are placed near the corner 614 instead of the single solder bump 106 shown in FIG. 6. An identifying mark or stamp 810 is shown in the corner 614 in FIG. 8 according to another embodiment of the present invention. The solder bumps 106 are placed around the stamp 810.

Figure 9:
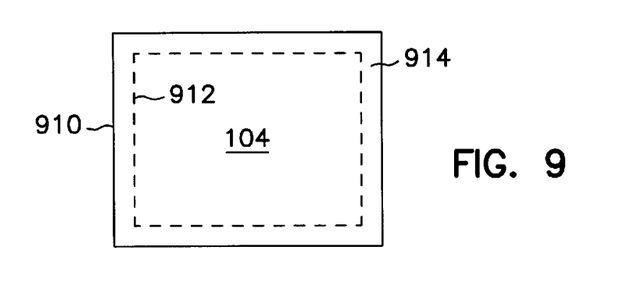
FIG. 9 is a top view of a die.
Figure 10:
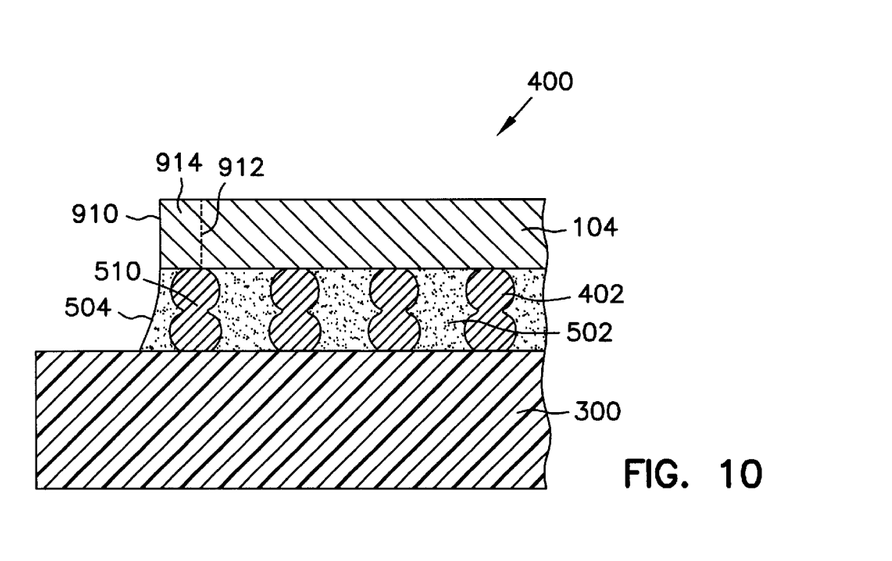
FIG. 10 is a cross-sectional view of an IC package.

A top view of the die 104 is shown in FIG. 9. The edges of the rectangular die 104 comprise a physical boundary 910 for the die 104. An active boundary 912 is shown inside the physical boundary 910. The active boundary 912 is a boundary in the die 104 delimiting the volume of silicon that carries electrical signals. All of the devices and functional circuits in the die 104 are located inside the active boundary 912, and the signals transmitted between the devices and functional circuits travel through the silicon inside the active boundary 912. Silicon between the active boundary 912 and the physical boundary 910 may be called an edge region 914 in the die 104 that provides a buffer to reduce crosstalk between devices in the die 104 and devices external to the die 104. Selected solder columns 510 in the IC package 400 may be located near the physical boundary 910 and relative to the active boundary 912 as shown in FIG. 10 which is a cross-sectional view of the IC package 400 showing the active boundary 912. In one embodiment of the present invention the solder column 510 is located in contact with the active boundary 912 and the edge region 914. In an alternative embodiment of the present invention (not shown) the solder column 510 is located in contact with the edge region 914 and between the active boundary 912 and the physical boundary 910. The solder columns 510 placed in contact with the edge region 914 are non-I/O columns because no signals exist in the edge region 914.

Figure 4:
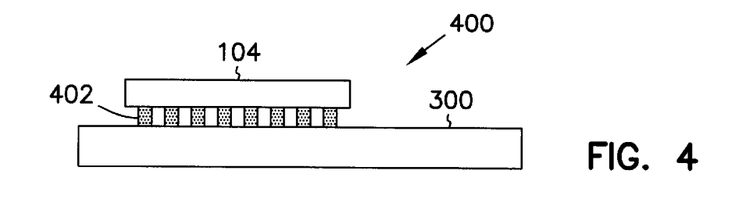
FIG. 4 is a side view of an IC package.

The solder columns 402,510 shown in FIGS. 4–5 may be utilized in different ways. For example, some of the solder columns 402,510 may be I/O columns that transmit I/O signals between the IC and the substrate 300. Other solder columns 402,510 may be non-I/O columns that are not connected to functional circuits and do not carry I/O signals. The non-I/O columns may be used solely to bear stress in the die 104. In alternate embodiments of the present invention some of the solder columns 402,510 may be connected to a test probe or otherwise used for testing the IC. The solder columns 402,510 may also be coupled to a ground voltage to provide additional ground connections or may be coupled to a power supply to provide extra power supply connections.

Figure 11:
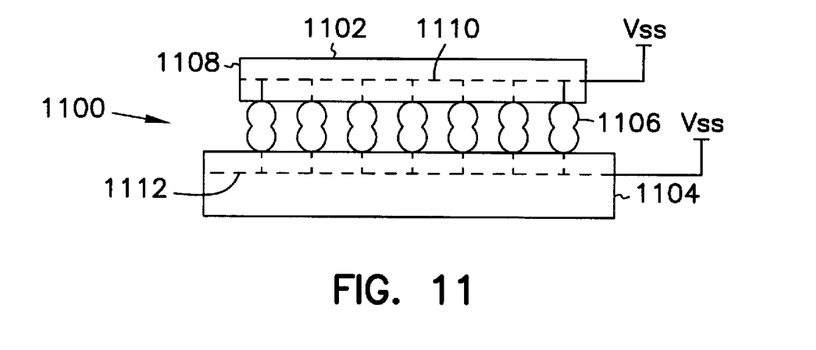
FIG. 11 is a side view of an IC package.

The solder columns 402,510 may also be used to provide shielding from electro-magnetic interference (EMI). An IC package 1100 according to another embodiment of the present invention is shown in FIG. 11. The IC package 1100 includes a die 1102 bonded to a substrate 1104 with a plurality of solder columns 1106 that are arranged along edges 1108 of the die 1102. The solder columns 1106 are spaced from one another to form a perimeter near the edges 1108 and each solder column 1106 is placed a selected distance from one of the edges 1108 of the die 1102. Epoxy underfill (not shown) may be forced between the die 1102 and the substrate 1104 in a manner similar to that shown in FIG. 5. The solder columns 1106 are connected between a metal mesh 1110 in the die 1102 and a metal mesh 1112 in the substrate 1104. The metal mesh 1110 and 1112 are shown as dashed lines in the die 1102 and the substrate 1104, and are comprised of an intersecting pattern of metal connections. The metal mesh 1110 and 1112 and the solder columns 1106 are connected to a voltage Vss and comprise an electrically conductive cage that shields an IC (not shown) inside the cage from EMI. The voltage Vss may be a ground voltage in a system including the IC package 1100. The solder columns 1106 therefore provide shielding from EMI and bear shear stress during thermal cycling of the IC package 1100.

Figure 12:
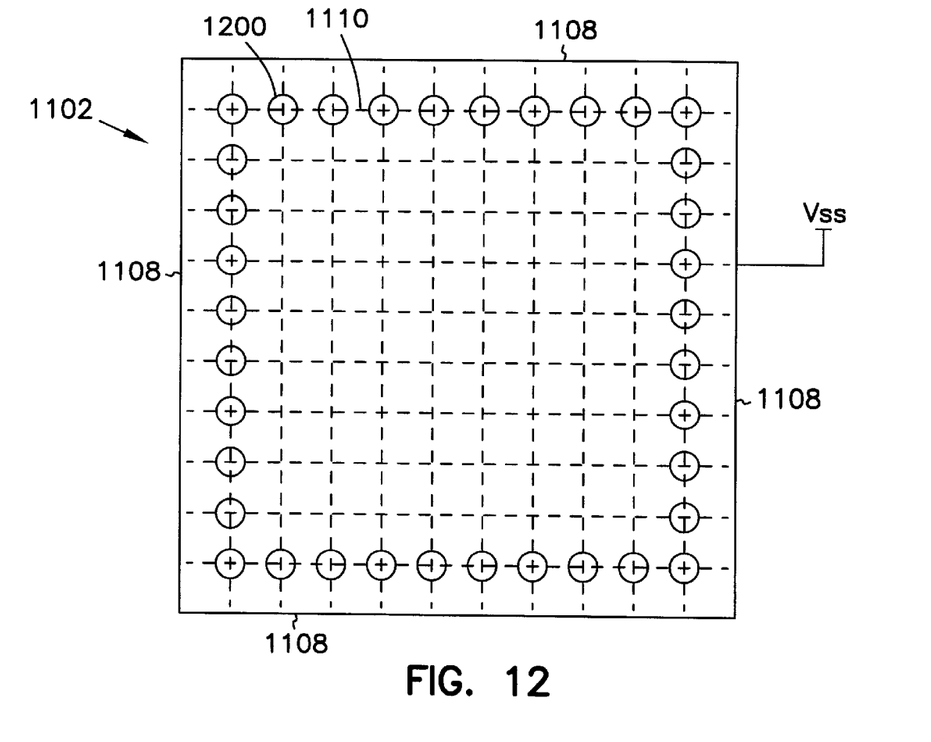
FIG. 12 is a top view of a die.

A top view of the die 1102 is shown in FIG. 12 according to the embodiment of the present invention before the die 1102 is bonded to the substrate 1104. The metal mesh 1110 is shown in dashed lines and also shown is a perimeter of solder bumps 1200 corresponding to the perimeter of solder columns 1106 in the IC package 1100. The solder bumps 1200 are placed a selected distance from one of the edges 1108 of the die 1102 and correspond to a matching set of solder bumps (not shown) on the substrate 1104. The die 1102 and the substrate 1104 are bonded in a reflow procedure similar to the reflow procedure described above with respect to FIGS. 3–5 to form the IC package 1100. The perimeter of solder bumps 1200 may be placed near the edges 1108 in a manner similar to the placement of the solder bumps 106 shown in FIGS. 6–8.

Figure 13:
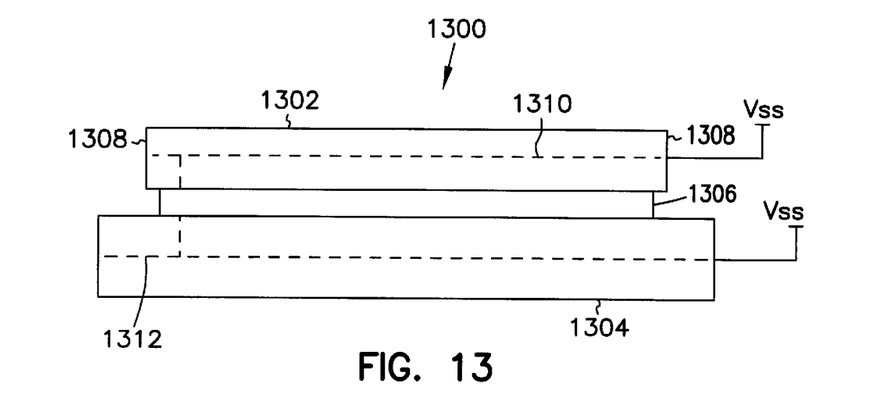
FIG. 13 is a side view of an IC package.

An IC package 1300 according to another embodiment of the present invention is shown in FIG. 13. The IC package 1300 includes a die 1302 bonded to a substrate 1304 with a perimeter wall 1306 of solder that is arranged along edges 1308 of the die 1302. The perimeter wall 1306 is placed a selected distance from the edges 1308 of the die 1302 and is connected between a metal mesh 1310 in the die 1302 and a metal mesh 1312 in the substrate 1304. The metal mesh 1310 and 1312 and the perimeter wall 1306 are connected to a voltage Vss to comprise an electrically conductive cage that shields an IC (not shown) inside the cage from EMI. The perimeter wall 1306 is similar to the solder columns 1106 shown in FIG. 11 in that it provides shielding from EMI and bears shear stress during thermal cycling of the IC package 1300.

A top view of the die 1302 is shown in FIG. 14 according to the embodiment of the present invention before the die 1302 is bonded to the substrate 1304. The metal mesh 1310 is shown connected to the perimeter wall 1306 and to the voltage Vss. The perimeter wall 1306 is placed a selected distance 1400 from the edges 1308 of the die 1302. The perimeter wall 1306 is aligned with a corresponding perimeter wall or bonding pad (not shown) on the substrate 1304, and the die 1302 is bonded to the substrate 1304 in a solder reflow procedure to form the IC package 1300.

Figure 15:
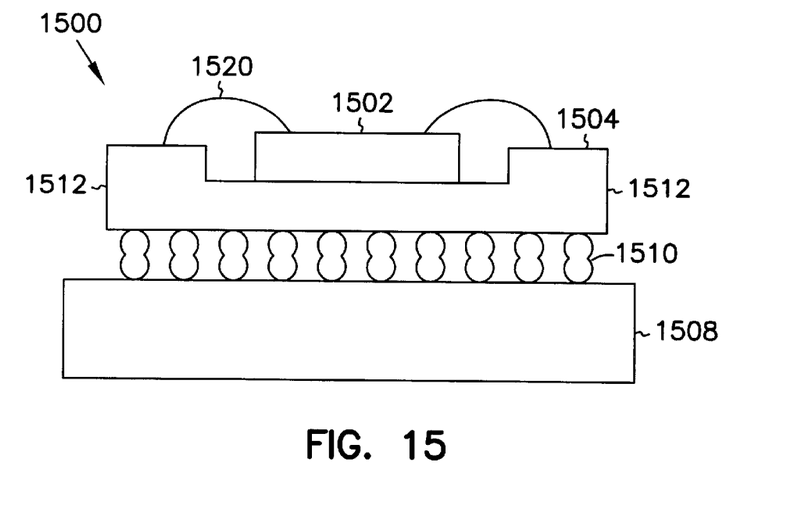
FIG. 15 is a side view of a ball-grid array package.
Figure 16:
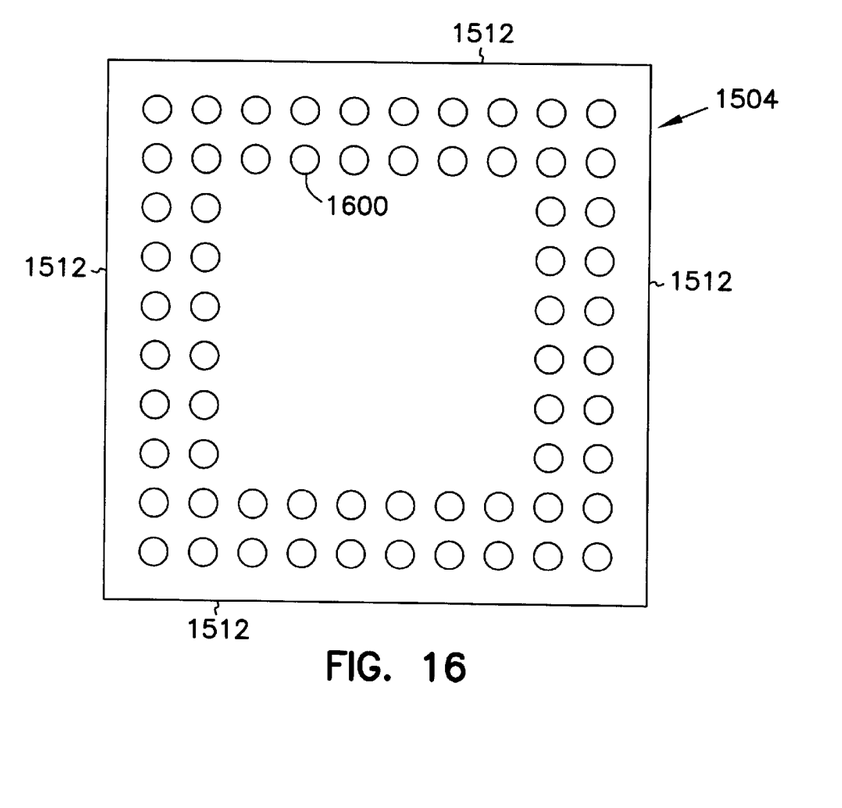
FIG. 16 is a bottom view of a body for a ball-grid array package.

A ball-grid array package 1500 is shown in FIG. 15 according to an embodiment of the present invention. An IC is formed in a die 1502 that is placed in a body 1504. The body 1504 is bonded to a substrate 1508 with a plurality of solder columns 1510 placed a selected distance from edges 1512 of the body 1504. I/O signals from the IC in the die 1502 are transmitted along wire leads 1520 through the body 1504 and some of the solder columns 1510 to the substrate 1508. Some of the solder columns 1510 closest to the edges 1512 may be non-I/O columns that do not transmit the I/O signals while the remainder are I/O columns that transmit the I/O signals. A bottom view of the body 1504 is shown in FIG. 16 before the body 1504 is bonded to the substrate 1508. A pattern of solder bumps 1600 is shown some of which are placed a selected distance from the edges 1512 in a manner similar to the placement of the solder bumps 106 shown in FIG. 68. The ball-grid array package 1500 is completed by aligning the solder bumps 1600 with corresponding solder bumps (not shown) on the substrate 1508 and conducting a reflow procedure to form the solder columns 1510. Epoxy underfill (not shown) may be forced between the body 1504 and the substrate 1508 in a manner similar to that shown in FIG. 5. The solder columns 1510 bear shear stress during thermal cycling of the ball-grid array package 1500 in a manner similar to the solder columns described with respect to FIGS. 4–5.

Figure 17:
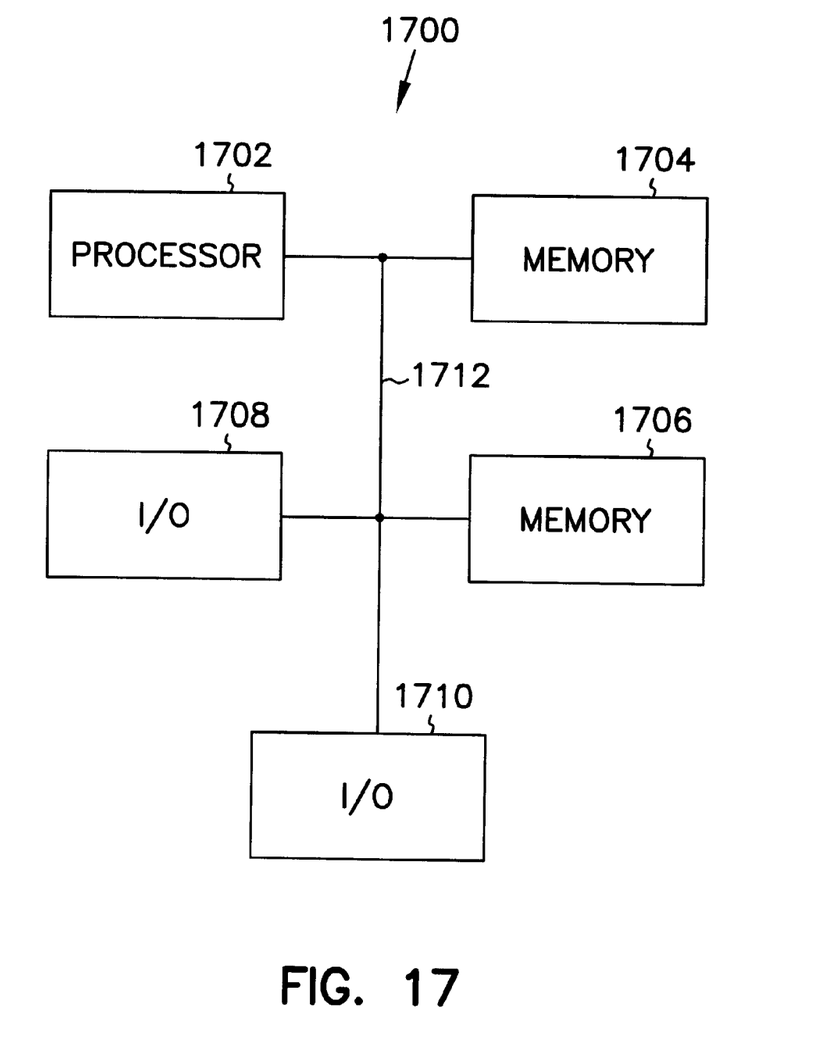
FIG. 17 is a block diagram of a computer system.

An IC package assembled according to any one of the embodiments of the present invention described above may be included in a computer system such as a computer system 1700 according to an embodiment of the present invention and shown in a block diagram in FIG. 17. The computer system 1700 includes a processor 1702, two memory devices 1704,1706 and two input/output (I/O) devices 1708,1710. Each of the memory devices 1704,1706 is either a random-access memory (RAM), a read-only memory (ROM), a cache memory, or a storage device such as a hard disk drive, a floppy disk drive, an optical disk drive, or a tape cartridge drive. Each of the I/O devices 1708,1710 is either a monitor, a pointing device such as a mouse, a keyboard, or a modem. The devices in the computer system 1700 including the processor 1702, the two memory devices 1704,1706 and the two I/O devices 1708,1710 communicate with each other through a bus 1712 connected to the devices. One skilled in the art having the benefit of this description will recognize that more devices such as processors, memory circuits, and I/O devices may be connected to the bus 1712.

Those skilled in the art with the benefit of the present description can appreciate that the present invention may be practiced with any computerized system including, for example, a video game, a hand-held calculator, a personal computer, or a multi-processor supercomputer, or an information appliance such as, for example, a cellular telephone, a pager, or a daily planner or organizer, or an information component such as, for example, a magnetic disk drive or telecommunications modem, or other appliance such as, for example, a hearing aid, washing machine or microwave oven having an electronic controller.

Figure 18:
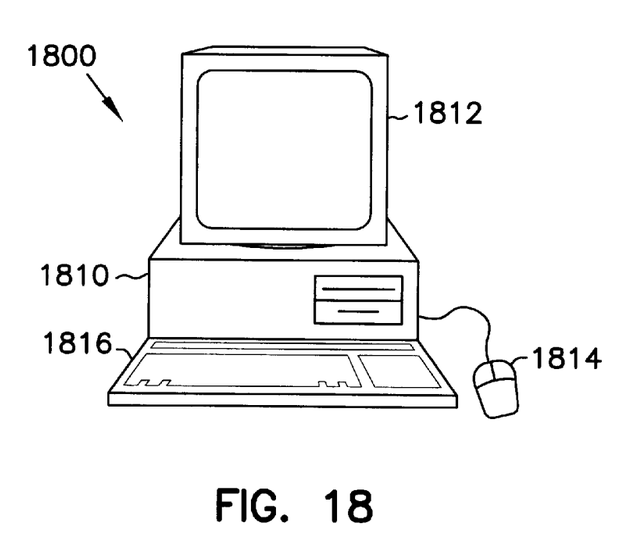
FIG. 18 is a block diagram of a personal computer.

The computer system 1700 shown in FIG. 17 may take the form of a personal computer 1800 shown in FIG. 18. The personal computer 1800 includes a computer 1810 that is operatively coupled to a monitor 1812, a pointing device 1814, and a keyboard 1816. The computer 1810 includes a processor, a random-access memory (RAM), a read-only memory (ROM), and one or more storage devices, such as a hard disk drive, a floppy disk drive (into which a floppy disk can be inserted), an optical disk drive, and a tape cartridge drive. The memory, hard drives, floppy disks, etc., are types of computer-readable media. The present invention is not particularly limited to one type of computer 1810. The monitor 1812 permits the display of information within a viewing area, including computer, video and other information, for viewing by a user of the personal computer 1800. The present invention is not limited to any particular monitor 1812, and the monitor 1812 is one type of display device that may be used in a system with the present invention. Such monitors include cathode ray tube (CRT) displays, as well as flat panel displays such as liquid crystal displays (LCD's). The pointing device 1814 permits a control of the screen pointer provided by graphical user interfaces. The present invention is not limited to any particular pointing device 1814. Such pointing devices include mouses, touch pads, trackballs, wheels, remote controls and point sticks. Finally, the keyboard 1816 permits entry of textual information into the computer 1810 and the present invention is not limited to any particular type of keyboard.

The solder bumps, solder columns, and the perimeter wall of solder described herein are deformable adhesive bumps, columns, and walls that one skilled in the art having the benefit of this description will understand to be deformable when heated and to assume a bonding structure when cooled. Other materials known to those skilled in the art having the benefit of this description may also be deformable and adhesive and may therefore be substituted for the solder described herein.

Although specific embodiments have been illustrated and described herein, it will be appreciated by those skilled in the art having the benefit of this description that any equivalent arrangement may be substituted for the specific embodiments shown. The present invention is therefore limited only by the claims and equivalents thereof.

What is claimed is:

1. A computer system comprising:
   a processor connected to a bus;
   a memory connected to the bus;
   an input/output device connected to the bus; and
   an integrated circuit package in the processor, the memory device, or the input/output device, the integrated circuit package comprising:
   an integrated circuit formed in a die having an edge;
   a substrate; and
   a plurality of non-I/O columns bonded between the substrate and the die a selected distance from the edge of the die.

2. The computer system of claim 1 wherein each column comprises a stress bearing solder column.

3. The computer system of claim 1 wherein each column has a center, a diameter and an edge, and the edge of each of the columns is bonded a selected distance from the edge of the die that is less than or equal to the diameter of the column.

4. The computer system of claim 1, further comprising:
   a metal mesh located in the die and connected to the columns and to a reference voltage; and
   a metal mesh located in the substrate and connected to the columns and to the reference voltage wherein the metal mesh in the die and the substrate and the columns shield the integrated circuit from EMI.

5. The computer system of claim 1 wherein:
   the die is located in a body and a plurality of wires are connected between the die and the body to transmit I/O signals between the die and the body;
   the columns are bonded between the body and the substrate to form a ball grid array package; and
   further comprising a plurality of I/O columns bonded between the body and the substrate to transmit the I/O signals.

6. A method comprising:
   forming an integrated circuit in a die having an edge;
   placing a plurality of first deformable adhesive bumps on the die in a high strain region of the die;
   placing a plurality of second deformable adhesive bumps on a surface of a substrate;
   aligning the first and second deformable adhesive bumps; and bonding the die to the substrate by reforming the first and second deformable adhesive bumps into a plurality of non-I/O columns bonded between the substrate and the die to reduce strain in the die.

7. The method of claim 6 wherein:
placing a plurality of first deformable adhesive bumps comprises placing a plurality of first solder bumps on the die;
placing a plurality of second deformable adhesive bumps comprises placing a plurality of second solder bumps on a surface of a substrate;
bonding the die comprises bonding the die to the substrate in a solder reflow procedure for the first and second solder bumps.

8. The method of claim 6 wherein placing a plurality of first deformable adhesive bumps comprises placing a plurality of first deformable adhesive bumps on the die, each bump having an edge placed a selected distance from the edge of the die that is less than or equal to a diameter of the bump.

9. The method of claim 6 wherein placing a plurality of first deformable adhesive bumps comprises placing a plurality of first deformable adhesive bumps on the die in contact with an edge region of the die.

10. The method of claim 6 wherein:
placing a plurality of first deformable adhesive bumps comprises placing a plurality of first deformable adhesive bumps on the die in contact with a metal mesh in the die;
placing a plurality of second deformable adhesive bumps comprises placing a plurality of second deformable adhesive bumps on a surface of a substrate in contact with a metal mesh in the substrate; and
bonding the die comprises bonding the die to the substrate by reforming the first and second deformable adhesive bumps into a plurality of non-I/O columns bonded between the substrate and the die and connected between the metal mesh in the die and the substrate to shield the integrated circuit from EMI.

11. The method of claim 6, further comprising forcing an epoxy underfill between the die and the substrate to surround the columns.

12. The method of claim 11, further comprising raising and lowering a temperature of the die, the substrate, the non-I/O columns, and the epoxy underfill to generate deformation of the epoxy underfill and strain the die.

13. A method comprising:
forming an integrated circuit in a die having a surface and an edge; and
placing a plurality of deformable adhesive bumps on the surface of the die in a high strain region of the die to reduce strain in the die.

14. The method of claim 13 wherein placing a plurality of deformable adhesive bumps comprises:
placing a plurality of solder bumps on the surface of the die a selected distance from the edge, one or more of the solder bumps placed the selected distance from the edge being electrically non-functional; and
placing a plurality of solder bumps on the surface of the die at a distance from the edge that is greater than the selected distance.

15. The method of claim 13 wherein placing a plurality of deformable adhesive bumps comprises placing a center of each of a plurality of deformable adhesive bumps on the surface of the die a selected distance from the edge that is less than or equal to a diameter of the bump.

16. The method of claim 13 wherein placing a plurality of deformable adhesive bumps comprises placing an edge of each of a plurality of deformable adhesive bumps on the surface of the die a selected distance from the edge that is less than or equal to a diameter of the bump.

17. The method of claim 13 wherein forming an integrated circuit comprises forming an integrated circuit in a rectangular silicon die having a surface and four edges joined at four corners to define a physical boundary of the silicon die.

18. The method of claim 17 wherein:
forming an integrated circuit further comprises forming the integrated circuit inside an active boundary that is inside the physical boundary of the silicon die to define an edge region in the silicon die between the active boundary and the physical boundary; and
wherein placing a plurality of deformable adhesive bumps comprises placing a plurality of deformable adhesive bumps on the surface of the silicon die having portions in contact with the active boundary and the edge region of the silicon die.

19. The method of claim 17 wherein:
forming an integrated circuit further comprises forming the integrated circuit inside an active boundary that is inside the physical boundary of the silicon die to define an edge region in the silicon die between the active boundary and the physical boundary; and
wherein placing a plurality of deformable adhesive bumps comprises placing a plurality of deformable adhesive bumps on the surface of the silicon die in contact with the edge region of the silicon die between the active boundary and the physical boundary.

20. A method comprising:
forming an integrated circuit in a die having a surface and an edge;
placing a plurality of deformable adhesive bumps on the surface of the die a selected distance from the edge;
bonding the die to a substrate through a plurality of deformable adhesive columns comprising the bumps; and
placing underfill between the die and the substrate.

21. The method of claim 20 wherein placing a plurality of deformable adhesive bumps comprises:
placing a plurality of solder bumps on the surface of the die a selected distance from the edge, at least one of the bumps placed a selected distance from the edge being electrically non-functional; and
placing a plurality of solder bumps on the surface of the die inside the bumps placed a selected distance from the edge.

22. The method of claim 20 wherein placing a plurality of deformable adhesive bumps comprises placing a center of each of a plurality of deformable adhesive bumps on the surface of the die a selected distance from the edge that is less than or equal to a diameter of the bump.

23. The method of claim 20 wherein placing a plurality of deformable adhesive bumps comprises placing an edge of each of a plurality of deformable adhesive bumps on the surface of the die a selected distance from the edge that is less than or equal to a diameter of the bump.

24. The method of claim 20 wherein:
forming an integrated circuit comprises:
preparing a wafer of silicon having a surface;
forming a plurality of integrated circuits on the surface of the wafer; and forming a repeating rectangular pattern of scribe lines in the surface of the wafer, each integrated circuit being surrounded by a rectangle of scribe lines;

placing a plurality of deformable adhesive bumps comprises:

placing a plurality of solder bumps inside each rectangle on the surface of the wafer, selected ones of the solder bumps in each rectangle being placed a selected distance from each scribe line of the rectangle;

conducting a reflow procedure to reflow the solder bumps; and cutting the wafer along the scribe lines to separate silicon dies from the wafer, each silicon die having four edges corresponding to the scribe lines that define a physical boundary surrounding the integrated circuit in the silicon die, and each silicon die having a plurality of the solder bumps placed a selected distance from the physical boundary;

bonding the die to a substrate comprises:

aligning the solder bumps on the silicon die with corresponding solder bumps or bonding pads on a plastic substrate; and conducting a reflow procedure to join the solder bumps on the silicon die with the solder bumps or the bonding pads on the plastic substrate to form solder columns connecting the silicon die to the plastic substrate; and placing underfill between the die and the substrate comprises forcing epoxy between the silicon die and the plastic substrate to surround the solder columns with the epoxy.

25. The method of claim 24 wherein:

forming an integrated circuit further comprises forming each integrated circuit inside an active boundary that is inside the rectangle of scribe lines to define an edge region between the active boundary and the rectangle of scribe lines; and wherein placing a plurality of solder bumps comprises placing a plurality of solder bumps inside each rectangle of scribe lines, the solder bumps having portions in contact with the active boundary and the edge region.

26. The method of claim 24 wherein:

forming an integrated circuit further comprises forming each integrated circuit inside an active boundary that is inside the rectangle of scribe lines to define an edge region between the active boundary and the rectangle of scribe lines; and wherein placing a plurality of solder bumps comprises placing a plurality of solder bumps inside each rectangle of scribe lines, the solder bumps being in contact with the edge region between the active boundary and the rectangle of scribe lines.

* * * * *

UNITED STATES PATENT AND TRADEMARK OFFICE
CERTIFICATE OF CORRECTION

PATENT NO. : 6,734,544 B2
DATED : May 11, 2004
INVENTOR(S) : Yan et al.

It is certified that error appears in the above-identified patent and that said Letters Patent is hereby corrected as shown below:

<u>Title page,</u>
Below item [62], insert
-- [56]        References Cited
          U.S. PATENT DOCUMENTS

| | | | |
|---|---|---|---|
| 5,075,965 | 12/1991 | Carey et al. | 29/840 |
| 5,359,768 | 11/1994 | Halley | 29/840 |
| 5,381,832 | 11/1998 | Gillette et al. | 361/760 |
| 5,399,898 | 03/1995 | Rostoker | 257/499 |
| 5,700,715 | 12/1997 | Pasch | 437/183 |
| 5,726,502 | 03/1998 | Beddingfield | 257/797 |
| 5,785,799 | 07/1998 | Culanane et al. | 156/379.7 |
| 5,798,285 | 08/1998 | Bentlage et al. | 438/108 |
| 6,125,042 | 09/2000 | Verdi et al. | 361/760 --. |

Signed and Sealed this

Thirteenth Day of July, 2004

JON W. DUDAS
*Acting Director of the United States Patent and Trademark Office*